(12) United States Patent
Powell et al.

(10) Patent No.: US 6,464,779 B1
(45) Date of Patent: Oct. 15, 2002

(54) COPPER ATOMIC LAYER CHEMICAL VAPOR DESPOSITION

(75) Inventors: Ronald A. Powell, San Carlos, CA (US); James A. Fair, Mountain View, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 09/766,143

(22) Filed: Jan. 19, 2001

(51) Int. Cl.$^7$ ............................................. C30B 29/02
(52) U.S. Cl. .................. 117/89; 117/104; 117/102; 117/537
(58) Field of Search ................. 117/104, 89, 102, 117/937

(56) References Cited

U.S. PATENT DOCUMENTS 5,916,365 A    6/1999   Sherman
6,203,613 B1 * 3/2001   Gates et al. ............... 117/104

OTHER PUBLICATIONS

Utriainen et al., "Studies of metallic thin film growth in an atomic layer epitaxy reactor using M9acac)2 M= Ni, Cu, Pt precursors", Applied Surface Sciences vol. 157 (2000) pp. 151–158.*

Per Martensson and Jan–Otto Carlsson, "Atomic Layer Epitaxy of Copper on Tantalum", Chem. Vapo. Deposition 1997, vol. 3, No. 1, pp. 45–50.

S. M. George, A. W. Ott, and J. W. Klaus, "Surface Chemistry for Atomic Layer Growth", J. Phys. Chem, 1996, 100, 13121–13131.

Shin Yokoyama, Hiroshi Goto, Takahiro Miyamoto, Norihiko Ikeda, and Kentaro Shibahara, "Atomic Layer Controlled Deposition of Silicon Nitride and in Situ Growth Observation By Infrared Reflection Absorption Spectroscopy", Applied Surface Science, 112 (1997) 75–81.

Kaupo Kukli, Mikko Ritala, and Markku Leskela, Atomic Layer Epitaxy Growth of Tantalum Oxide Thin Films from $Ta(OC_2H_5)_5$ and $H_2O$, J. Electrochem. Soc., vol. 142, No. 5, May 1995, 1670–1675.

* cited by examiner

Primary Examiner—Robert Kunemund
(74) Attorney, Agent, or Firm—Beyer Weaver & Thomas, LLP

(57) ABSTRACT

This invention pertains to systems and methods for atomic layer chemical vapor deposition. More specifically, the invention pertains to methods for copper atomic layer chemical vapor deposition, particularly to deposit a seed layer prior to the electrochemical Cu fill operation in integrated circuit fabrication. It also pertains to apparatus modules for performing such deposition.

20 Claims, 5 Drawing Sheets

| Cu(hfac)L, L= | State (at room T) | Vapor Pressure (60° C) | Stability | $E_a$ (kcal/mol) for ligand (L) dissociation[68] |
|---|---|---|---|---|
| Trimethylphosphine (PMe$_3$) | solid | 0.080 Torr | air sensitive | 28.0 |
| 1,5-Cyclo Octadiene (1,5-COD) | solid | 0.055 Torr | air stable | 14.2 |
| Trimethylvinylsilane (tmvs) | liquid | 1.3 Torr | air sensitive | 12.0 |
| (2-butyne) | solid | | air sensitive | 8.5 |

FIG. 4

COPPER ATOMIC LAYER CHEMICAL VAPOR DESPOSITION

FIELD OF THE INVENTION

This invention pertains to systems and methods for atomic layer chemical vapor deposition. More specifically, the invention pertains to methods for copper atomic layer chemical vapor deposition, particularly to deposit a seed layer prior to the electrochemical Cu fill operation in integrated circuit fabrication. It also pertains to apparatus modules for performing such deposition.

BACKGROUND OF THE INVENTION

Integrated circuit (IC) manufacturers have traditionally used aluminum and aluminum alloys, among other metals, as the conductive metal for integrated circuits. While copper has a greater conductivity than aluminum, it has not been used because of certain challenges it presents, including the fact that it readily diffuses into silicon oxide and degrades insulating electrical properties even at very low concentrations. Recently, however, IC manufacturers have been turning to copper because of its high conductivity and electromigration resistance, among other desirable properties. Most notable among the IC metalization processes that use copper is Damascene processing.

Damascene processing is a method for forming metal lines on integrated circuits. It involves formation of inlaid metal lines in trenches and vias formed in a dielectric layer (inter-metal dielectric). A barrier layer that blocks diffusion of copper atoms is formed over the dielectric layer topology. Damascene processing is often a preferred method because it requires fewer processing steps than other methods and offers a higher yield. It is also particularly well-suited to metals such as Cu that cannot readily be patterned by plasma etching.

In a typical copper IC process, the formation of the desired conductive wires on the chip generally begins with a seed layer, usually deposited by physical vapor deposition (PVD). The seed layer provides a conformal, conductive layer on which a thicker layer of copper is electrofilled in order to fill in the features (e.g., trenches and vias) of the semiconductor wafer. PVD has traditionally been used to form the seed layer, but does not always provide totally conformal step coverage, particularly with respect to surface features with high aspect ratios (greater than about 5:1), where aspect ratio refers to the ratio of the feature height to the feature width. Coverage that is not conformal means coverage that is uneven, i.e., thicker in some places than others, and that may include actual gaps where the metal is discontinuous, all of which are highly undesirable in IC manufacturing. Modem integrated circuit manufacturing has moved toward features with these high-aspect ratios, particularly in advanced integrated circuits where copper is used at the conductive metal, e.g., Damascene processing. For instance, a typical via may have a diameter of 0.07 $\mu$m (the width of 266 copper atoms) but have a depth of 0.4 $\mu$m, which is an aspect ratio of 5.7:1.

Chemical vapor deposition (CVD) is another process by which the seed layer can be deposited. However, poor nucleation of the copper at the barrier layer is a common problem with CVD, as is agglomeration, the latter being caused by the relatively high temperatures [>150° C.] required by CVD techniques of the current art. Both of these problems can result in non- non-conformal deposition. Also, the high substrate temperature consumes a significant fraction of the thermal budget allowed for IC manufacture. Another problem with these CVD processes is that their carbon-containing or fluorine-containing precursor compounds can cause interface contamination, thus causing poor adhesion of the copper CVD seed layer to the underlying barrier layer. This can lead to reliability problems where subsequent stress-inducing steps such as chemical mechanical polishing (CMP) are carried out.

SUMMARY OF THE INVENTION

The present invention provides systems and methods for atomic layer chemical vapor deposition (ALCVD). More specifically, the invention pertains to methods for atomic layer vapor deposition of copper, particularly to form seed layers for integrated circuit fabrication, as well as apparatus modules for performing such deposition. Copper ALCVD provides a method by which highly conformal copper layers of a single atom thickness can be applied to the substrate. Copper ALCVD thus effectively engineers the copper seed layer on an atomic level.

One aspect of the invention provides for a method for atomic layer depositing of a metal, including exposing a substrate surface to a metal precursor in order to deposit an atomic layer of the precursor, exposing the atomic layer of the precursor to an oxidizing agent, thus leaving behind an atomic layer of oxidized metal, and exposing the oxidized metal to a reducing agent, thus reducing the oxidized metal to metal and leaving an atomic layer of the metal. The metal to be deposited can be copper. The method can be repeated to form more than one atomic layer. The method can be used to deposit part or all of a seed layer in an integrated circuit manufacturing process, for example, Damascene processing.

Another aspect of the invention provides for a method for atomic layer depositing of a metal, including exposing a substrate surface to a metal precursor in order to deposit an atomic layer of the precursor, and exposing the atomic layer of the precursor leaving to an oxidizing agent, thus leaving behind an atomic layer of the metal. The metal to be deposited can be copper. The method can be repeated to form more than one atomic layer. The method can be used to deposit part or all of a seed layer in an integrated circuit manufacturing process, for example, Damascene processing.

Another aspect of the invention provides for an apparatus module for performing atomic layer chemical vapor deposition, the module including a source of organo-metal precursor to metal, a source of oxidizing agent capable of converting the precursor to metal oxide, a source of reducing agent capable of reducing the metal oxide back to elemental copper and a substrate support heated to a temperature at which a monolayer of precursor adheres to the substrate. The apparatus can also include a semiconductor wafer. The copper can be metal, and the apparatus can be used to form part or all of a seed layer for integrated circuit manufacturing.

Another aspect of the invention provides for an apparatus module for performing atomic layer chemical vapor deposition, the module including a source of organo-metal precursor to metal, a source of oxidizing agent capable of converting the precursor to metal, and a substrate support heated to a temperature at which a monolayer of precursor adheres to the substrate. The apparatus can also include a semiconductor wafer. The copper can be metal, and the apparatus can be used to form part or all of a seed layer for integrated circuit manufacturing.

These methods and apparatus are particularly useful in conformally coating features (e.g., trenches, vias and lines) having small dimensions (e.g., at most about 0.26 μm) and/or high aspect ratios (e.g. at least about 5:1). These and other features and advantages of the present invention will be described in more detail below with reference to the associated drawings.

BRIEF DESCRIPTION OF THE DRAWINGS

FIG. 4 is a table listing various copper precursors and their properties.

DETAILED DESCRIPTION OF THE PREFERRED EMBODIMENTS

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well-known processes, procedures and components have not been described in detail so as not to unnecessarily obscure aspects of the present invention.

A "semiconductor wafer" as referred to in this invention is a semiconductor substrate at any of the various states of manufacture in the production of integrated circuits. One standard semiconductor wafer described in this invention is a silicon wafer 200 mm in diameter, 0.75 mm thick, with an approximate radius of curvature of about 0.15 millimeters (see SEMI Specification M1-0298). Of course, semiconductor wafers of other dimensions, such as standard 300 mm diameter silicon wafers, can also be processed in accordance with this invention. Note that standard specifications for a 300 mm diameter wafer may be found in SEMI Specification M1.15-0997.

A "substrate surface" as referred to in this invention is any surface whereupon an atomic layer is to be deposited. Substrate surfaces include, but are not limited to, semiconductor surfaces in various states of manufacture, including the barrier layer.

The current invention is compatible with any sort of semiconductor manufacturing where a thin "seed" layer of copper must be deposited. This seed layer is typically deposited in preparation for a thicker electrofill layer. A particular semiconductor process that is compatible with the invention is Damascene processing, but the current invention is not limited to Damascene processing or semiconductor processing in general. The current invention is useful in many applications where a thin layer or layers of metal must be deposited.

Figure 1A:
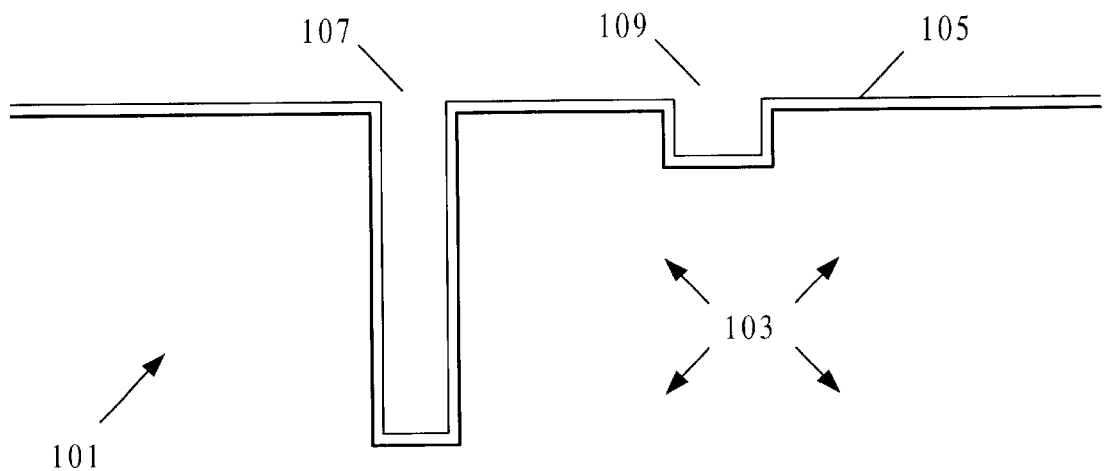
FIG. 1A is a schematic illustration of a semiconductor substrate, showing the dielectric substrate, barrier layer, and surface features.
Figure 1B:
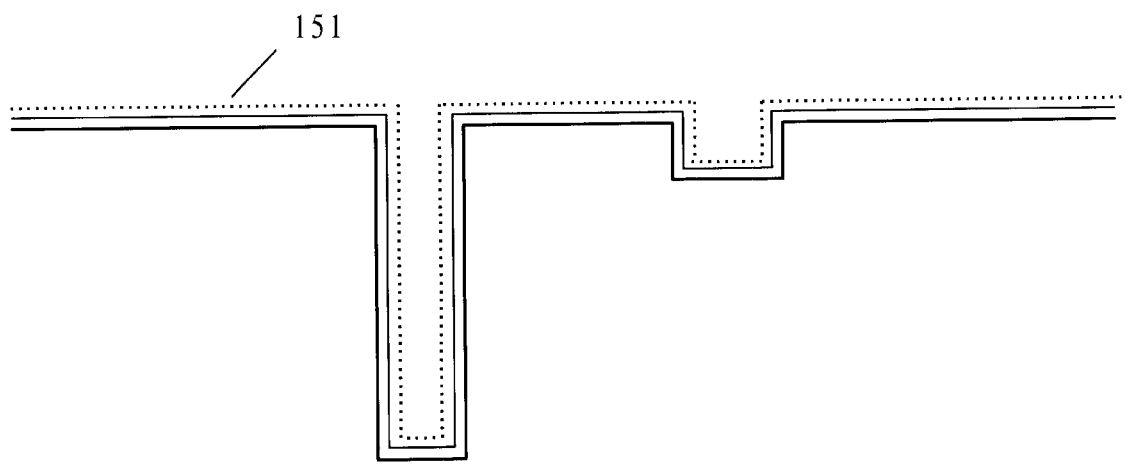
FIG. 1B shows the same semiconductor substrate as in FIG. 1A with the barrier layer covered by a monolayer deposited by ALCVD.

FIG. 1A schematically illustrates a portion of a semiconductor wafer 101. The illustration shows the underlying dielectric substrate 103 (typically silicon dioxide) and the barrier layer 105. The figures also illustrates two features of the semiconductor surface 107 and 109, the first having a high-aspect ratio. PVD and CVD methods of the current art often cannot cover such high-aspect features in a conformal manner (step coverage), particularly when features 107 and 109 have deep submicron dimensions. The current invention, however, is able to deposit a conformal monolayer, illustrated as layer 151 of FIG. 1B.

Figure 2:
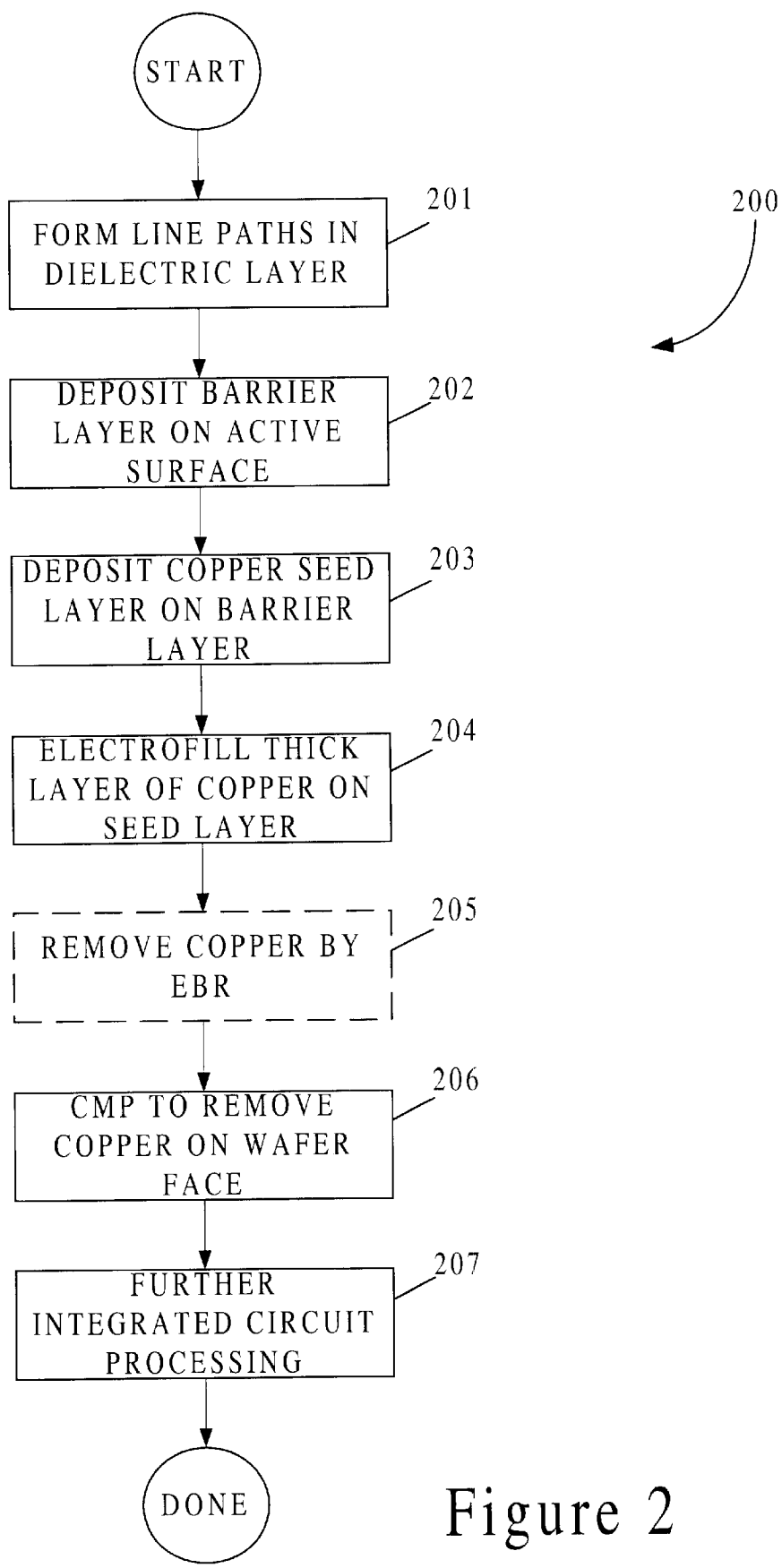
FIG. 2 is a process flow diagram illustrating relevant operations employed to form conductive copper lines by Damascene processing.

A typical Damascene process flow 200 is illustrated in the flowchart of FIG. 2 in order to contextualize the present invention. Process 200 begins with formation of line paths 101 in a previously formed dielectric layer. These line paths may be etched as trenches and vias in a blanket layer of dielectric such as silicon dioxide. The line paths define conductive routes between various devices on a semiconductor wafer. Because copper or other mobile conductive material provides the conductive paths of the semiconductor wafer, the underlying dielectric layers must be protected from metal ions (e.g., $Cu^{+1}$) that might otherwise diffuse into the silicon. To accomplish this, the process includes depositing a thin diffusion barrier layer 202 before depositing the metal. Suitable materials for the diffusion barrier layer include titanium, tantalum (Ta), tantalum nitride (TaN), tantalum nitride silicon (TaNSi), tungsten (W), titanium (Ti), titanium tungsten (TiW), titanium nitride silicon (TiNSi) and the like. The barrier layer is often formed by a PVD process such as sputtering.

Before inlaying the line paths with the electrofill copper, a conductive surface coating must be applied. In the depicted process, this is accomplished by depositing a copper seed layer on the barrier layer at 203. This seed layer is deposited with by copper ALCVD, as will be described in detail below. Copper ALCVD may be used in combination with other CVD or PVD processes to form the seed layer. The copper ALCVD operation is described in detail below. The wafer is then electrofilled at 204 with a thicker layer of copper over the seed layer, by electroplating using an electroplating solution. The copper is deposited to a thickness that completely fills the various line paths in the dielectric layer. If any of features of the semiconductor wafer have very small dimensions and high-aspect ratios, then the copper ALCVD and/or other seed layer process may in fact replace the electrofill step. For instance, a high-aspect via cut into the surface of the semiconductor wafer, if only a few atoms wide, can be filled by an atomic layering process of only a few atoms, because in such a case there is no real distinction between layering and filling.

After deposition of the copper, by whatever means, is completed, the copper is planarized, generally by chemical-mechanical polishing (CMP) down to the dielectric at 206 in preparation for further processing (illustrated at 207), generally the addition of subsequent dielectric and metalization layers.

Atomic Layer Chemical Vapor Deposition (ALCVD)

ALCVD is a process that has been in use since the 1970's. Atomic layer deposition, as its name implies, involves the deposition of a single atomic layer of material by a chemical vapor. Because of its very nature, ALCVD has generally been used in epitaxial applications, where small amounts of materials (often expensive or exotic) are deposited in low-throughput applications. ALCVD is used to coat small tools and jewelry, and to form crystalline structures.

ALCVD has rarely been used to deposit conductive metal on integrated circuit wafers. This is because the metals that are typically used in integrated circuits (e.g., aluminum), tend to form oxides that are very stable and difficult to reduce back to the non-oxidized form. Metal oxides are very typical by-products, and thus generally cannot be avoided as part of the deposition process, which will be described in detail below. Copper, on the other hand, forms two oxides, cuprous ($Cu_2O$) and cupric oxide (CuO), that are not nearly as stable as the aluminum oxides, and one metastable oxide, $CU_4O_3$, that can be though of as a combination of cuprous and cupric oxide, where one unit cell of $CU_4O_3$ stoichiometrically equals $Cu_2O$ +CuO.

Therefore ALCVD is a viable process for depositing copper, and the present invention has exploited this fact to develop useful ALCVD processes for copper. The present invention thus exploits ALCVD to engineer the copper seed layer at the atomic level. The ALCVD process as described provides extremely conformal, uniform coverage even with high-aspect ratio circuit features (i.e., step coverage). In addition, ALCVD can be practiced at relatively low temperatures and short times, thus consuming relatively little of the thermal budget of the fabrication process. The invention as practiced also allows for the use of apparatus and procedures that are simpler and less expensive than those used by PVD and CVD processes of the current art. ALCVD operates by saturating the surface with single monolayer coverage. Because it operates in a saturation regime, the process is flow and pressure insensitive. This allows a simpler and cheaper design of the hardware. This saturation regime is also fairly temperature insensitive, so the temperature control requirements can be eased, thus allowing for a simpler and cheaper temperature control system. An apparatus module that is used for ALCVD in one application can also be adapted to deposit layers of different thickness in different applications, and even to deposit different materials.

Figure 3:
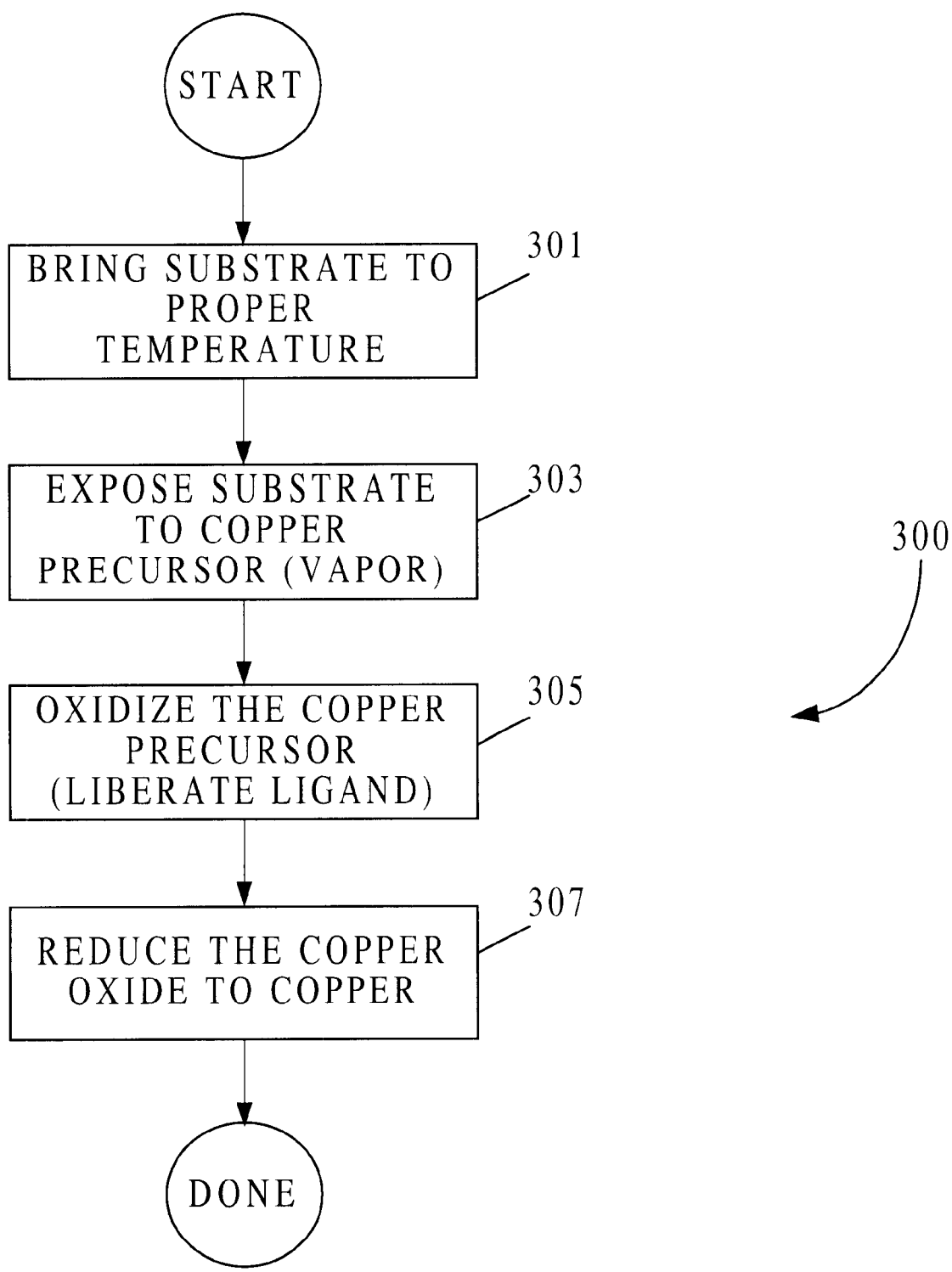
FIG. 3 is process flow diagram illustrating relevant operations employed to perform ALCVD in the context of the present invention.

FIG. 3 is a high-level flowchart which illustrates a preferred embodiment for practicing the ALCVD method 300. The same apparatus module, an example of which is described in below in FIG. 6, may be used to carry out the ALCVD and some or all of the other operations, such as barrier layer deposition and additional seed layer operations, of an IC manufacturing process, an example of which was described in FIG. 2. The ALCVD may also be carried out in a separate module of its own.

In 301, the semiconductor wafer is stabilized at a proper temperature for ALCVD, typically 50-200° C. Next, the wafer is exposed to a high-vapor pressure, copper precursor at 303. These copper precursors typically have the form CuXL, where the copper is bonded to a Lewis acid (X) and a stabilizing ligand (L). Examples of such copper precursors with ligands include $Cu^I$(hfac)(tmvs), $Cu^I$(hfac)(1,5COD), $Cu^I$(hfac)(Pme3), $Cu^I$(hfac)(2-butyne) and $Cu_1(thd)_2$, each of which have the Lewis acid hexafluoro-acetylacetonate (hfac). The preferred precursor is $Cu^I$(hfac)(tmvs), which is sold under the brand name CupraSelect™ and is available from Air Products, Inc., of Allentown, Pa. $Cu^I$(hfac)(tmvs) has a high vapor pressure and is liquid at room temperature, which makes it easy to store and handle. FIG. 4 lists these copper precursors, along with the full chemical names of their ligands, vapor pressures at 60° C., and activation energies for ligand dissociation.

For $Cu^I$(hfac)(tmvs), the semiconductor substrate is preferably stabilized at a temperature of between about 60 and 100° C. Before the substrate reaches this temperature, it is held in vacuum or inert atmosphere. It takes approximately $10^{-6}$ torr/second (one second at $10^{-6}$ torr) for a monolayer of atoms or molecules to strike an exposed substrate (in CVD chemistry, this unit of measure is known as a Langmuir). Since not all of the atoms that strike the surface will adhere to it, the actual number of atoms that adhere to the surface will depend on an adhesion coefficient for the surface at the given temperature. In the case of the current invention, the deposition may be preferably carried out at a partial pressure of 10–15 mtorr for 1 to 1000 seconds. The deposition can be carried out at low pressure, or more preferably, at atmospheric or near atmospheric pressure with a neutral gas such as argon to take up the remaining pressure. The use of atmospheric or near atmospheric pressure is preferred, since this obviates the need for expensive vacuum pumping. The plasma exposure is carried out for a sufficient time to remove all carbonaceous material. Other oxidizing ambients or gas admixtures could also be used, e.g., NO, $O_2$/He, $O_2$/air.

After deposition, the atomic layer is exposed to oxygen, which liberates the ligand and oxidizes the copper 305. This is typically done rapidly and efficiently by an atomic oxygen plasma discharge. For example, molecular oxygen may be introduced into a plasma reactor to generate the oxygen plasma. Next, a reducing atmosphere, typically in the form of molecular hydrogen plasma, is then exposed to the copper to reduce it back to the metal 307. An RF plasma is typically used to generate the reactive hydrogen. Actual exposure time is unimportant as long as it is of sufficient duration to reduce the oxides that were formed in the previous operation. In an alternative embodiment, the atomic layer of precursor can be exposed to an oxidizing agent that liberates the ligand without oxidizing the metal. The oxidizing agent may be water vapor. It is apparent to one of skill in the art to use appropriate process conditions for exposing the precursor to water vapor in order to liberate the ligand.

The single atomic layer of copper can be used as the seed layer for the electrofill described in 204. Typically, however, the actual seed layer should be somewhat thicker. PVD or conventional CVD can be carried out on top of the copper ALCVD layer, which serves as a well-adhered, conformal primer for the seed layer. The copper ALCVD layer can be repeated one or more times to thicken this primer, or even to complete the entire seed layer. Repeating the ALCVD too many times may reduce the IC manufacturing throughput to an undesirable level, however, since by its very nature ALCVD can only deposit one atomic layer at a time. When the seed layer is complete, regardless of how it is prepared, the semiconductor wafer is then ready for the electrofill process, 204.

Figure 5:
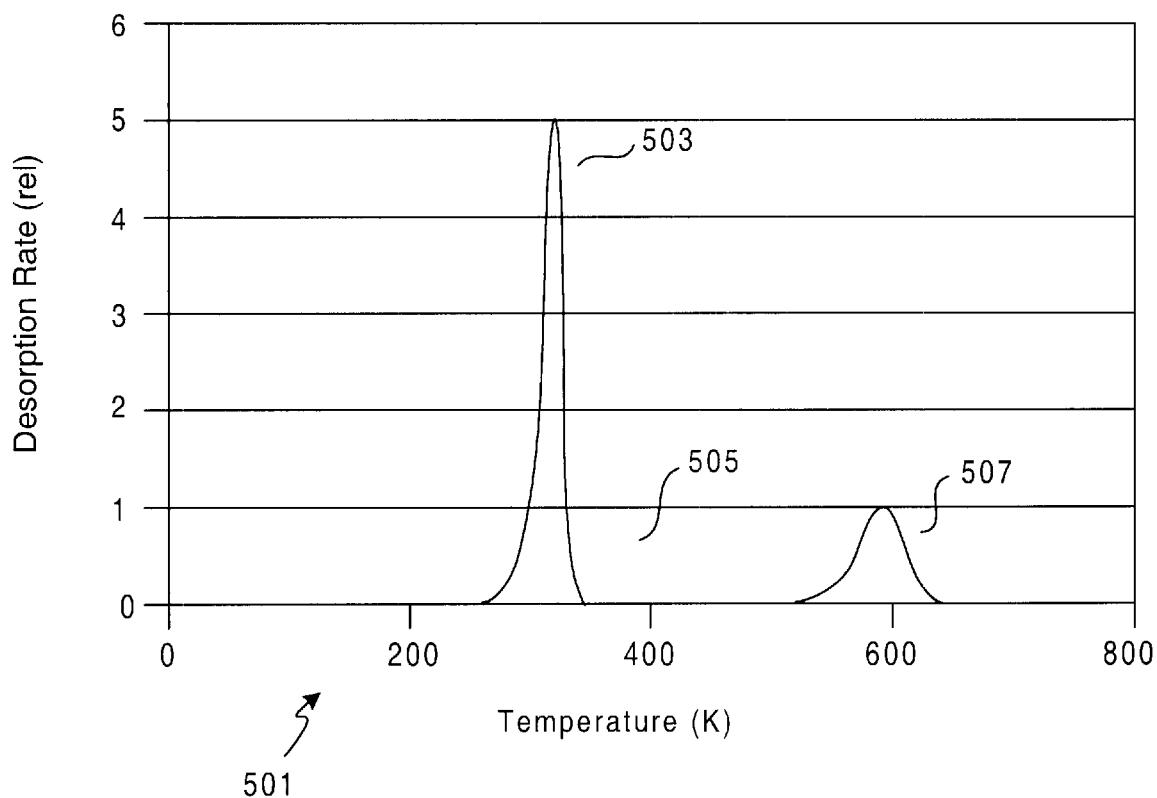
FIG. 5 is a generic temperature desorption spectroscopy graph illustrating the different temperatures for energy of chemibsorption and energy of condensation.

ALCVD relies on the fact that the energy of condensation on a homogenous surface is generally lower than the energy of chemibsorption between two heterogeneous surfaces. For example, consider a substrate surface (i.e., a semiconductor wafer with a barrier layer) at a low temperature which is covered with several layers of a molecule such as $Cu^I$(hfac) L. If we raise the temperature, at a certain point, the upper layers of the molecules will begin to desorb from the substrate. This is illustrated in the generic temperature desorption spectroscopy graph, 501 of FIG. 5, where the large, low temperature peak 503, represents the upper layers desorbing from the substrate. Next, typically, there is a temperature range where no desorption occurs. See 505. This is because the upper layers, with the lower, energy of condensation, has been desorbed, but the temperature is not sufficiently high to desorb the last layer. Desorption of the layermono-layer is represented by the smaller, higher temperature peak, 507.

If the copper deposition is carried out in this temperature range, represented in the generic plot as peak 507, then a single atomic layer, and only a single layer, will deposit on the substrate. This temperature will vary based on the nature of the substrate and depositing molecule. For deposition of a copper precursor on a typical barrier layer used in IC manufacturing such as tantalum, this temperature is typically between about [150 and 300° C.]. Those of skill in the art will understand how to determine the temperature for monolayer absorption of a given substrate and precursor. In one example, one generates a plot as described in FIG. 5. A further discussion of the concepts of ALCVD can be found in S. M. George, et. al., "Surface Chemistry for Atomic Layer Growth," *J. Phys Chem,* 1996, 100(31) (13121–13131), which is herein incorporated by reference in its entirety for all purposes.

An ALCVD system, in which the invention may be practiced will now be described. Inside the apparatus chamber, the semiconductor wafer, sits on top of a supporting pedestal. The supporting pedestal has a thermocouple or other temperature sensing mechanism attached to it to precisely monitor the temperature of the wafer. The wafer can be heated by any number of commonly-known methods, such a wire coil. The apparatus includes a plasma discharge source, which is used to introduce the oxygen and hydrogen plasma at the appropriate points during the process. A copper precursor source, typically stores the copper precursor as a liquid. The ALCVD system also includes a pressure gauge, to monitor the pressure within the chamber, a neutral gas source (e.g., argon) and a pump. The ALCVD system can also include a water source that can be used to expose the atomic layer of precursor to water vapor, rather than oxygen, as the oxidizing agent. The water vapor may liberate the ligand without oxidizing the copper, thus obviating the need for a separate reduction operation.

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A method of atomic layer chemical vapor deposition of a metal, the method comprising:
   (a) exposing a substrate surface to a metal precursor, wherein the temperature of the substrate surface ensures that only one atomic layer of the precursor will adhere to the substrate surface;
   (b) exposing the atomic layer of the precursor to an oxidizing agent to leave behind an oxidized metal; and
   (c) exposing the metal oxide to a reducing agent, thus reducing the metal oxide to the metal and leaving an atomic layer of the metal on the substrate surface.

2. The method of claim 1 wherein the metal is copper or a copper alloy.

3. The method of claim 1 wherein the atomic layer chemical vapor deposition of the metal is used to form part or all of a seed layer for integrated circuit manufacturing.

4. The method of claim 1 wherein (a) (b) and (c) are repeated at least once to deposit more than one atomic layer of the metal.

5. The method of claim 1 wherein the method is used to fill a semiconductor feature that has an aspect ratio of at least about 5:1.

6. The method of claim 1 wherein the semiconductor feature has a dimension at most about 0.26 $\mu$m.

7. The method of claim 1 wherein the method is used in Damascene processing.

8. The method of claim 1 wherein the copper precursor is selected from the group consisting of $Cu^I$(hfac)(tmvs), $Cu^I$(hfac)(1,5COD), $Cu^I$(hfac)(Pme3), $Cu^I$(hfac) (2-butyne) and $Cu^I$(thd)$_2$.

9. The method of claim 1 wherein the copper precursor is $Cu^I$(hfac)(tmvs).

10. The method of claim 1 wherein the oxidizing agent is oxygen plasma or an oxygen-containing plasma.

11. The method of claim 1 wherein the reducing agent is hydrogen plasma or a hydrogen-containing plasma.

12. A method of atomic layer chemical vapor deposition of a metal, the method comprising:
    (a) exposing a substrate surface to a metal precursor, wherein the temperature of the substrate surface ensures that only one atomic layer of the precursor will adhere to the substrate surface; and
    (b) exposing the atomic layer of the precursor to an oxidizing agent that liberates the metal from the metal precursor without oxidizing the metal in the metal precursor, thus leaving an atomic layer of the metal on the substrate surface.

13. The method of claim 12 wherein the metal is copper or a copper alloy.

14. The method of claim 12 wherein the atomic layer chemical vapor deposition of the metal is used to form part or all of a seed layer for integrated circuit manufacturing.

15. The method of claim 12 wherein (a) and (b) are repeated at least once to deposit more than one atomic layer of the metal.

16. The method of claim 12 wherein the method is used to fill a semiconductor feature that has an aspect ratio of at least about 5:1.

17. The method of claim 12 wherein the semiconductor feature has a dimension at most about 0.26 $\mu$m.

18. The method of claim 12 wherein the method is used in Damascene processing.

19. The method of claim 12 wherein the copper precursor is selected from the group consisting of $Cu^I$(hfac)(tmvs), $Cu^I$(hfac)(1,5COD), $Cu^I$(hfac)(Pme3), Cu1(hfac) (2-butyne) and $Cu^I$(thd)$_2$.

20. The method of claim 12 wherein the copper precursor is $Cu^I$(hfac)(tmvs).

* * * * *